United States Patent
Hauser

(10) Patent No.: US 8,024,143 B2
(45) Date of Patent: Sep. 20, 2011

(54) METHOD FOR ASCERTAINING A MAINS FREQUENCY IN A VOLTAGE SIGNAL, AND MAINS ANALYZER

(75) Inventor: Rainer Hauser, Nürnberg (DE)

(73) Assignee: Siemens Aktiengesellschaft, Münich (DE)

( * ) Notice: Subject to any disclaimer, the term of this patent is extended or adjusted under 35 U.S.C. 154(b) by 496 days.

(21) Appl. No.: 12/222,112

(22) Filed: Aug. 1, 2008

(65) Prior Publication Data
US 2009/0063073 A1  Mar. 5, 2009

(30) Foreign Application Priority Data

Aug. 3, 2007 (DE) .......................... 10 2007 037 060

(51) Int. Cl.
*G01R 23/00* (2006.01)
(52) U.S. Cl. ........................................................ 702/75
(58) Field of Classification Search ................ 702/75
See application file for complete search history.

(56) References Cited

U.S. PATENT DOCUMENTS
2008/0111507 A1* 5/2008 Yalla et al. .................... 318/105

FOREIGN PATENT DOCUMENTS
EP 0 311 825 A1 4/1989
EP 1 847 838 A1 10/2007

OTHER PUBLICATIONS
Judith C. Brown; "A high resolution fudnamental frequency determination based on phase changes of the Fourier transform"; in J. Acoust. Soc. Am. 94 (2), p. 662-667; US, Aug. 1993.

* cited by examiner

*Primary Examiner* — Michael P Nghiem
(74) *Attorney, Agent, or Firm* — Harness, Dickey & Peirce, P.L.C.

(57) ABSTRACT

A method for ascertaining a mains frequency from a voltage signal which has a particularly high proportion of harmonics includes stipulating a sample frequency for a sample collection, polling a voltage signal at equidistant times during periods of the sample oscillation. A discrete Fourier transform may be used to calculate two phases, and a phase interval between these two phases is used to infer the mains frequency.

18 Claims, 2 Drawing Sheets

METHOD FOR ASCERTAINING A MAINS FREQUENCY IN A VOLTAGE SIGNAL, AND MAINS ANALYZER

PRIORITY STATEMENT

The present application hereby claims priority under 35 U.S.C. §119 on German patent application number DE 10 2007 037 060.3 filed Aug. 3, 2007, the entire contents of which is hereby incorporated herein by reference.

FIELD

Embodiments of the invention generally relate to a method for ascertaining a mains frequency in a voltage signal, and/or to a mains analyzer.

BACKGROUND

Power supply mains usually provide an AC voltage, for example 230 volts. In central Europe, the frequency of the AC voltage (mains frequency) is 50 Hz. Both the amplitude of the voltage and the mains frequency may be subject to fluctuations. Mains analyzers detect the amplitude of the AC voltage. This requires the mains analyzers to know the mains frequency as exactly as possible.

To derive the mains frequency in a mains analyzer, the voltage zero crossings are usually evaluated in a received voltage signal. If implausible values are eliminated, it is possible to derive the period of the AC voltage from the zero crossings, with mains analyzers checking a relatively large number of periods and forming an average.

If the voltage signal has a high level of harmonics, there are additional zero crossings. These make it difficult to derive the period duration. For this reason, mains analyzers often dispense with accurate frequency detection when they receive signals loaded with harmonics. Instead, a nominal frequency is taken as a basis for the further data capture. This harms the accuracy of the actual measurements by the mains analyzer.

SUMMARY

In at least one embodiment of the invention, a reliable method is disclosed for ascertaining a mains frequency in a voltage signal which also works for signals with a high level of harmonics.

The method according to at least one embodiment of the invention comprises:

a) a sample frequency $f_s$ is stipulated for a sample oscillation,
b) the voltage signal is polled at N equidistant times for X periods of the sample oscillation, where X=5, 6, 7, ... (that is to say an integer greater than 4), to obtain N sample values $x_n$ for n=0, 1, ..., N−1,
c) a first phase $\phi_1(X)$ is ascertained on the basis of the formula $$\varphi_1(X) = \arctan\left[\frac{\sum_{n=0}^{N-l-1}\left(x_{n+l}\cos\left(\frac{X \times 2\pi \times n}{n}\right)\times w(n)\right)}{\sum_{n=0}^{N-l-1}\left(x_{n+l}\sin\left(\frac{X \times 2\pi \times n}{n}\right)\times w(n)\right)}\right]$$

where l=0, 1, ... and w (n) is a window function,
d) a second phase $\phi_2(X)$ is ascertained on the basis of the formula $$\varphi_2(X) = \arctan\left[\frac{\sum_{n=0}^{N-m}\left(x_{n+m}\cos\left(\frac{X \times 2\pi \times n}{N}\right)\times w(n)\right)}{\sum_{n=0}^{N-m}\left(x_{n+m}\sin\left(\frac{X \times 2\pi \times n}{N}\right)\times w(n)\right)}\right]$$

where m=1, 2, 3, ..., with m>1,
e) a frequency f is ascertained on the basis of the formula $$f = f_s \times \frac{|\varphi_2(X) - \varphi_1(X)|}{2\pi(m-1)}$$

as the mains frequency.

The inventive method of at least one embodiment is based on insights which have been obtained from frequency analysis in music and are described in the article by Judith C. Braun and Miller S. Puckette, "A high resolution fundamental frequency determination based on phase changes of the Fourier transform" in J. Acoust. Soc. Am. 94 (2), pt. 1, August 1993, page 662 ff, the entire contents of which are incorporated herein by reference.

In this case, the formula $\phi_1(X)$ is nothing other than the windowed phase, ascertained on the basis of the discrete Fourier transform, and $\phi_2(X)$ is the same phase. The phase for $\phi_1$ has been shifted by l sample values in comparison with the conventional phase calculation in this case. Preferably, $\phi_1(X)$ will be equal to the conventional Fourier phase, l=0. $\phi_2(X)$ is the Fourier phase with a weighting shifted by m sample values in the total and has been shifted by m−1 sample values in comparison with $\phi_1(X)$. Preferably, m−l=1 will be the case, i.e. $\phi_2$ follows $\phi_1$ directly. When l=0, m=1, and only $\phi_2(X)$ differs from the conventional Fourier phase in the definition.

Theoretically, the window function may be w(n)=1, or a simple rectangular window may have been defined. It is found to be advantageous to use a Hanning window. In that case, $$w(n) = \frac{1}{2}\left(1 - \cos\left(\frac{2\pi \times n}{N}\right)\right)$$

holds true.

The formula given in step e) of the method according to at least one embodiment of the invention takes account of the fact that the two phases are associated with different groups of sample values, namely starting at $x_1$ in the case of $\phi_1$ and starting at $x_m$ in the case of $\phi_2$, in each case through to $x_{N-1}$. In the case of adjacent phases, the phase interval between these two phases, normalized to $2\pi$, corresponds precisely to the compression factor, which needs to be multiplied by $f_s$ to obtain the mains frequency f.

It is not necessarily to be expected that the mains frequency will be ascertained precisely the very first time the method according to at least one embodiment of the invention is performed. A plurality of iterations may therefore be performed. For this, each iteration is preceded by the sample frequency $f_s$ being adjusted, namely set to $f_s$=f×N. If an accuracy of ε is required for f, the iterations can be performed until $$f = \frac{F_S}{N} \pm \varepsilon.$$

It is entirely possible for the frequency to be ascertained exactly after an infinite number of iterations, so that $\epsilon=0$ can be chosen.

At least one embodiment of the invention is also realized by a mains analyzer which has a pair of connections for detecting a voltage signal and which is designed to carry out the method according to at least one embodiment of the invention, particularly by virtue of suitable programming of a microprocessor in the mains analyzer.

BRIEF DESCRIPTION OF THE DRAWINGS

An example embodiment of the invention is described below with reference to the drawing.

DETAILED DESCRIPTION OF THE EXAMPLE EMBODIMENTS

Figure 1:
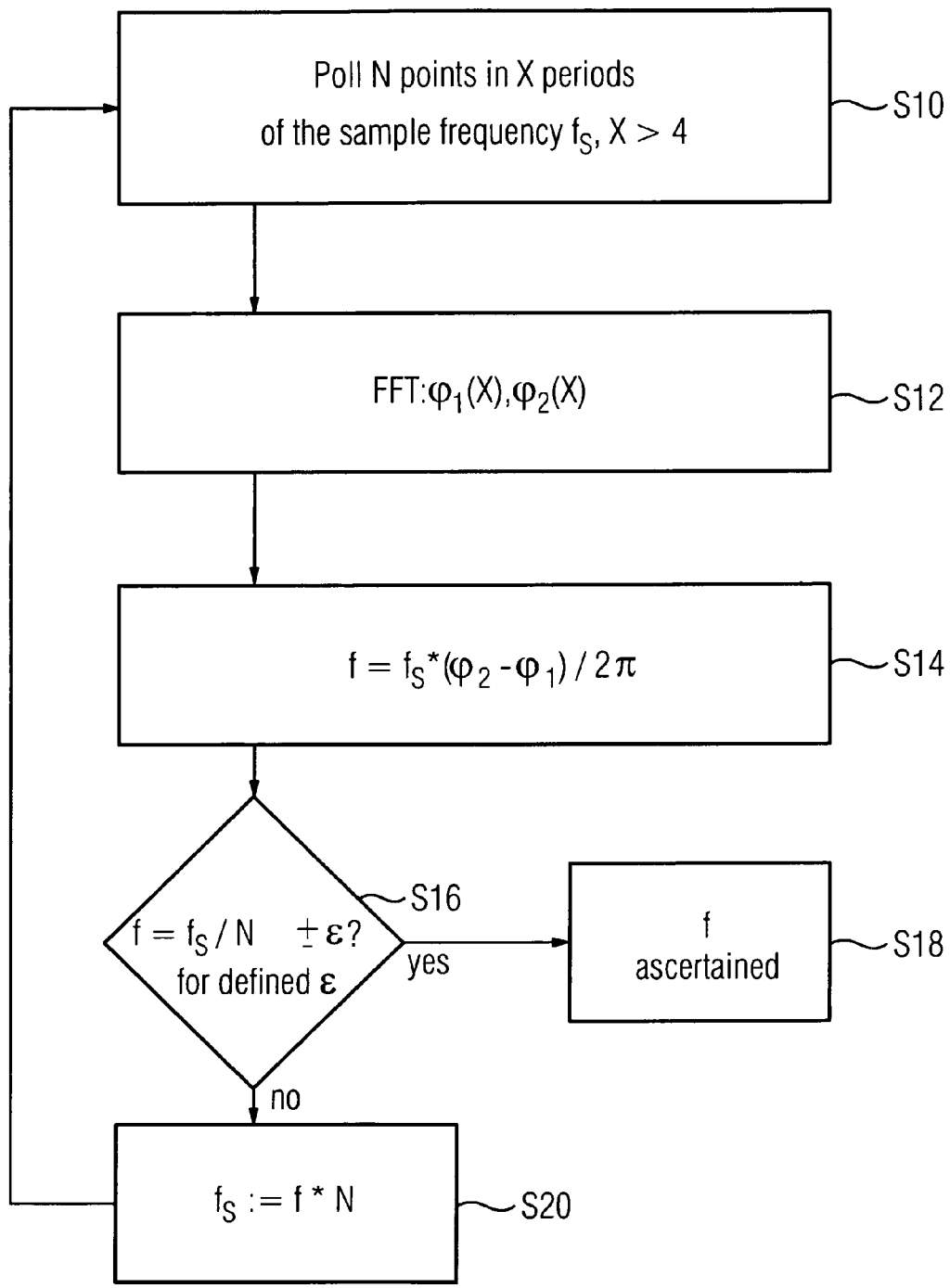
FIG. 1 illustrates the flow of the method according to an embodiment of the invention.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

The method according to an embodiment of the invention shown in FIG. 1 starts with a measurement (step S10): A sample frequency $f_s$ is stipulated, which is N times a nominal value for the mains frequency which needs to be ascertained by the method according to the invention. Since the X-th harmonic will be used later, the duration of X periods of the sample frequency $f_s$ is calculated and this is divided into N time intervals. In this case, X will be a natural number greater than 4. At these times, an input signal for the voltage is polled ("sampled") so that sample values $X_n$, are obtained, with n=0, 1, 2... N−1.

For the X-th harmonic, the discrete Fourier transform is then calculated with weighting by a window $$w(n) = \frac{1}{2}\left(1 - \cos\left(\frac{2\pi \times n}{N}\right)\right),$$

that is to say on the basis of the formula $$\varphi_1(X) = \arctan\left[\frac{\sum_{n=0}^{N-1}\left(x_n \times \cos\left(\frac{X \times 2\pi \times n}{N}\right) \times w(n)\right)}{\sum_{n=0}^{N-1}\left(x_n \times \sin\left(\frac{X \times 2\pi \times n}{N}\right) \times w(n)\right)}\right].$$

The same Fourier transform is then calculated at the interval of a sample value on the basis of $$\varphi_2(X) = \arctan\left[\frac{\sum_{n=0}^{N-1}\left(x_{n+1} \times \cos\left(\frac{X \times 2\pi \times n}{N}\right)\right) \times w(n)}{\sum_{n=0}^{N-1}\left(x_{n+1} \times \sin\left(\frac{X \times 2\pi \times n}{N}\right)\right) \times w(n)}\right].$$

The totals extend to $x_N$, but this can be treated as though $X_N=0$, since $w(n)=0$ for the relevant term in the sums.

In step S12, $\phi_1(X)$ and $\phi_2(A)$, that is to say two different phases, have therefore been ascertained.

In the next step S14, a frequency is calculated on the basis of the formula $$f = f_s \times \frac{\varphi_2 - \varphi_1}{2\pi}.$$

This calculated frequency f is an approximated value for the mains frequency which is to be ascertained. The next step S16 then involves a check being performed to determine whether f is sufficiently close to $$\frac{f_s}{N}.$$

In other words, a check is performed to determine whether $$f = \frac{f_s}{N} \pm \varepsilon,$$

where ε is the desired, previously defined accuracy of ascertainment. If f turns out to be $f_s/N$ within the accuracy of ascertainment, the method is terminated in the next step S18, and f is deemed to have been ascertained. If the check in step S16 reveals that f has not yet been ascertained sufficiently well, the sample frequency $f_s$ is set to the value f×N in the next step S20, and then the method is repeated through steps S10, S12, S14 and S16, specifically with the sample frequency respectively being reset in step S20 until step S18, that is to say the end of the method, has been reached.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program and computer program product. For example, of the aforementioned methods may be embodied in the form of a system or device, including, but not limited to, any of the structure for performing the methodology illustrated in the drawings.

Figure 2:
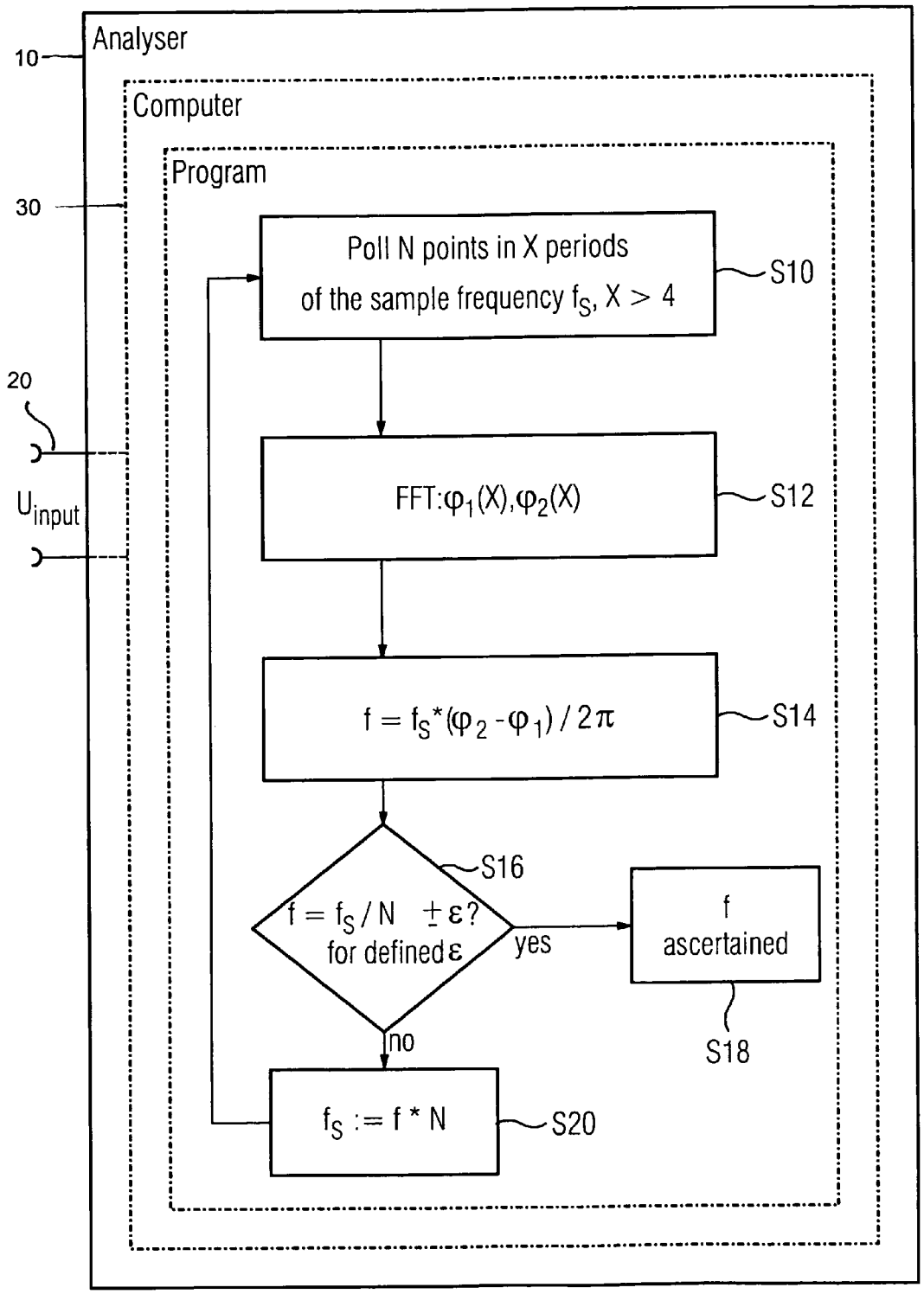
FIG. 2 shows a schematic representation of an apparatus useable to implement the method illustrated in FIG. 1.

In an example embodiment shown in FIG. 2, a mains analyzer 10 may include a pair of connections 20 for detecting a voltage signal, as a device to stipulate a sample frequency $f_s$ for a sample oscillation 30; a device to poll a voltage signal 30 and device to ascertain a first phase. As shown in FIG. 2, the mains analyzer may include a computer 30.

Even further, any of the aforementioned methods may be embodied in the form of a program. The program may be stored on a computer readable media and is adapted to perform any one of the aforementioned methods when run on a computer device (a device including a processor). Thus, the storage medium or computer readable medium, is adapted to store information and is adapted to interact with a data processing facility or computer device to perform the method of any of the above mentioned embodiments.

The storage medium may be a built-in medium installed inside a computer device main body or a removable medium arranged so that it can be separated from the computer device main body. Examples of the built-in medium include, but are not limited to, rewriteable non-volatile memories, such as ROMs and flash memories, and hard disks. Examples of the removable medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for ascertaining a mains frequency in a voltage signal using a mains analyzer, the method comprising:

stipulating a sample frequency $f_s$ for a sample oscillation in the mains analyzer;

polling a voltage signal, using a pair of connections of the mains analyzer, at N equidistant times in X periods of the sample oscillation, where X=5, 6, 7, . . . , to obtain N sample values $x_n$, with n=0, 1, . . . , N−1;

ascertaining, in the mains analyzer, a first phase $\phi_1(X)$ on the basis of the formula $$\varphi_1(X) = \arctan\left[\frac{\sum_{n=0}^{N-l-1}\left(x_{n+l}\cos\left(\frac{X \times 2\pi \times n}{N}\right)\right) \times w(n)}{\sum_{n=0}^{N-l-1}\left(x_{n+l}\sin\left(\frac{X \times 2\pi \times n}{N}\right)\right) \times w(n)}\right]$$

where l=0, 1, . . . and w (n) is a window function;

ascertaining, in the mains analyzer, a second phase $\phi_2(X)$ on the basis of the formula $$\varphi_2(X) = \arctan\left[\frac{\sum_{n=0}^{N-m}\left(x_{n+m}\cos\left(\frac{X \times 2\pi \times n}{N}\right)\right) \times w(n)}{\sum_{n=0}^{N-m}\left(x_{n+m}\sin\left(\frac{X \times 2\pi \times n}{N}\right)\right) \times w(n)}\right]$$

where m=1, 2, 3, . . . , with m>1; and ascertaining, in the mains analyzer, a frequency f on the basis of the formula $$f = f_s \times \frac{|\varphi_2(X) - \varphi_1(X)|}{2\pi(m-l)}$$

as the mains frequency.
2. The method as claimed in claim 1, wherein l=0.
3. The method as claimed in claim 2, wherein m−l=1.
4. The method as claimed in claim 2, wherein $$w(n) = \frac{1}{2}\left(1 - \cos\left(\frac{2\pi \times n}{N}\right)\right).$$

5. The method as claimed in claim 2, further comprising:
setting $f_s = f \times N$, and repeating the steps of polling, ascertaining and setting until $$f = \frac{f_s}{N} \pm \varepsilon,$$

where $\varepsilon \geqq 0$ is a value indicating accuracy of ascertainment, is true for the frequency f ascertained.
6. The method as claimed in claim 5, wherein $\varepsilon = 0$.
7. The method as claimed in claim 1, wherein m−l=1.
8. The method as claimed in claim 7, wherein $$w(n) = \frac{1}{2}\left(1 - \cos\left(\frac{2\pi \times n}{N}\right)\right).$$

9. The method as claimed in claim 7, further comprising:
setting $f_s = f \times N$, and repeating the steps of polling, ascertaining and setting until $$f = \frac{f_s}{N} \pm \varepsilon,$$

where $\varepsilon \geqq 0$ is a value indicating accuracy of ascertainment, is true for the frequency f ascertained.
10. The method as claimed in claim 9, wherein $\varepsilon = 0$.
11. The method as claimed in claim 1, wherein $$w(n) = \frac{1}{2}\left(1 - \cos\left(\frac{2\pi \times n}{N}\right)\right).$$

12. The method as claimed in claim 11, further comprising:
setting $f_s = f \times N$, and repeating the steps of polling, ascertaining and setting until $$f = \frac{f_s}{N} \pm \varepsilon,$$

where $\varepsilon \geqq 0$ is a value indicating accuracy of ascertainment, is true for the frequency f ascertained.
13. The method as claimed in claim 12, wherein $\varepsilon = 0$.
14. The method as claimed in claim 1, further comprising:
setting $f_s = f \times N$, and repeating the steps of polling, ascertaining and setting until $$f = \frac{f_s}{N} \pm \varepsilon,$$

where $\varepsilon \geqq 0$ is a value indicating accuracy of ascertainment, is true for the frequency f ascertained.
15. The method as claimed in claim 14, wherein $\varepsilon = 0$.
16. A mains analyzer, comprising:
a pair of connections for detecting a voltage signal, wherein the mains analyzer is designed to
stipulate a sample frequency $f_s$ for a sample oscillation;
poll a voltage signal at N equidistant times in X periods of the sample oscillation, where X=5, 6, 7, ..., to obtain N sample values $x_n$, with n=0, 1, ..., N-1;
ascertain a first phase $\phi_1(X)$ on the basis of the formula $$\varphi_1(X) = \arctan\left[\frac{\sum_{n=0}^{N-l-1}\left(x_{n+l}\cos\left(\frac{X \times 2\pi \times n}{N}\right) \times w(n)\right)}{\sum_{n=0}^{N-l-1}\left(x_{n+l}\sin\left(\frac{X \times 2\pi \times n}{N}\right) \times w(n)\right)}\right]$$

where l=0, 1, ... and w(n) is a window function;
ascertain a second phase $\phi_2(X)$ on the basis of the formula $$\varphi_2(X) = \arctan\left[\frac{\sum_{n=0}^{N-m}\left(x_{n+m}\cos\left(\frac{X \times 2\pi \times n}{N}\right) \times w(n)\right)}{\sum_{n=0}^{N-m}\left(x_{n+m}\sin\left(\frac{X \times 2\pi \times n}{N}\right) \times w(n)\right)}\right]$$

where m=1, 2, 3, ..., with m>l; and
ascertain a frequency f on the basis of the formula $$f = f_s \times \frac{|\varphi_2(X) - \varphi_1(X)|}{2\pi(m-l)}$$

as the mains frequency.
17. A mains analyzer for detecting a mains frequency, comprising:
a pair of connections for detecting a voltage signal;
means for stipulating a sample frequency $f_s$ for a sample oscillation;
means for polling a voltage signal at N equidistant times in X periods of the sample oscillation, where X=5, 6, 7, ..., to obtain N sample values $x_n$ with n=0, 1, ..., N-1;
means for ascertaining a first phase $\phi_1(X)$ on the basis of the formula $$\varphi_1(X) = \arctan\left[\frac{\sum_{n=0}^{N-l-1}\left(x_{n+l}\cos\left(\frac{X \times 2\pi \times n}{N}\right) \times w(n)\right)}{\sum_{n=0}^{N-l-1}\left(x_{n+l}\sin\left(\frac{X \times 2\pi \times n}{N}\right) \times w(n)\right)}\right]$$

where l=0, 1, ... and w(n) is a window function;
means for ascertaining a second phase $\phi_2(X)$ on the basis of the formula $$\varphi_2(X) = \arctan\left[\frac{\sum_{n=0}^{N-m}\left(x_{n+m}\cos\left(\frac{X \times 2\pi \times n}{N}\right) \times w(n)\right)}{\sum_{n=0}^{N-m}\left(x_{n+m}\sin\left(\frac{X \times 2\pi \times n}{N}\right) \times w(n)\right)}\right]$$

where m=1, 2, 3, . . ., with m>1; and means for ascertaining a frequency f on the basis of the formula $$f = f_s \times \frac{|\varphi_2(X) - \varphi_1(X)|}{2\pi(m-l)}$$

as the mains frequency.

18. A non-transitory computer readable medium including program segments for, when executed on a computer device, causing the computer device to implement a method for ascertaining a mains frequency in a voltage signal including:

stipulating a sample frequency $f_s$ for a sample oscillation;

polling a voltage signal at N equidistant times in X periods of the sample oscillation, where X=5, 6, 7, . . . , to obtain N sample values $x_n$, with n=0, 1, . . . , N−1.

ascertaining a first phase $\phi_1(X)$ on the basis of the formula $$\varphi_1(X) = \arctan\left[\frac{\sum_{n=0}^{N-l-1}\left(x_{n+l}\cos\left(\frac{X \times 2\pi \times n}{N}\right) \times w(n)\right)}{\sum_{n=0}^{N-l-1}\left(x_{n+l}\sin\left(\frac{X \times 2\pi \times n}{N}\right) \times w(n)\right)}\right]$$

where l=0, 1, . . . and w (n) is a window function;

ascertaining a second phase $\phi_2(X)$ on the basis of the formula $$\varphi_2(X) = \arctan\left[\frac{\sum_{n=0}^{N-m}\left(x_{n+m}\cos\left(\frac{X \times 2\pi \times n}{N}\right) \times w(n)\right)}{\sum_{n=0}^{N-m}\left(x_{n+m}\sin\left(\frac{X \times 2\pi \times n}{N}\right) \times w(n)\right)}\right]$$

where m=1, 2, 3, . . . , with m>1; and ascertaining a frequency f on the basis of the formula $$f = f_s \times \frac{|\varphi_2(X) - \varphi_1(X)|}{2\pi(m-l)}$$

as the mains frequency.

* * * * *

UNITED STATES PATENT AND TRADEMARK OFFICE
CERTIFICATE OF CORRECTION

| | | |
|---|---|---|
| PATENT NO. | : 8,024,143 B2 | Page 1 of 1 |
| APPLICATION NO. | : 12/222112 | |
| DATED | : September 20, 2011 | |
| INVENTOR(S) | : Rainer Hauser | |

It is certified that error appears in the above-identified patent and that said Letters Patent is hereby corrected as shown below:

On the Title page, item [73] should read

--(73) Assignee:  Siemens Aktiengesellschaft, Munich (DE)--

Signed and Sealed this

Twenty-fourth Day of January, 2012

David J. Kappos
*Director of the United States Patent and Trademark Office*